US00RE39615E

(19) United States
(12) Reissued Patent
Poutasse

(10) Patent Number: US RE39,615 E
(45) Date of Reissued Patent: May 8, 2007

(54) ADHESIVE COMPOSITIONS AND COPPER FOILS AND COPPER CLAD LAMINATES USING SAME

(75) Inventor: Charles A. Poutasse, Lake Oswego, OR (US)

(73) Assignee: Nikko Materials USA, Inc., Chandler, AZ (US)

(21) Appl. No.: 10/617,653

(22) Filed: Oct. 17, 2002

Related U.S. Patent Documents

Reissue of:
(64) Patent No.: 6,132,851
Issued: Oct. 17, 2000
Appl. No.: 08/267,877
Filed: Jun. 28, 1994

(51) Int. Cl.
*B23B 3/00* (2006.01)

(52) U.S. Cl. ..... 428/209; 428/408; 428/413; 428/417; 428/418; 428/446; 428/457; 428/901; 525/109; 525/113

(58) Field of Classification Search ..... 428/209, 428/674, 626, 615, 413, 417; 528/158.5
See application file for complete search history.

(56) References Cited

U.S. PATENT DOCUMENTS

| | | | | | |
|---|---|---|---|---|---|
| 3,496,130 | A | * | 2/1970 | Wasem et al. | 260/26 |
| 3,935,053 | A | * | 1/1976 | Armstrong | 156/64 |
| 4,020,225 | A | * | 4/1977 | Fujiwara | 428/901 |
| 4,246,162 | A | * | 1/1981 | Schreiber | 260/37 |
| 4,343,843 | A | * | 8/1982 | Johnson | 428/272 |
| 5,061,550 | A | * | 10/1991 | Shimizu | 428/209 |
| 5,071,914 | A | * | 12/1991 | Simmel | 525/113 |

FOREIGN PATENT DOCUMENTS

| | | | |
|---|---|---|---|
| EP | 0012714 | * | 6/1980 |
| EP | 0148493 | * | 8/1986 |
| EP | 0371242 | * | 6/1990 |
| JP | 62-101674 | * | 5/1987 |

OTHER PUBLICATIONS

Search Report for European Application 95304380.9.*
Epoxy Resins, Chem & Tech., May 8, 1989, Marcel Dekker Inc., pp. 683–691, 1089–1095.*

* cited by examiner

*Primary Examiner*—Rena Dye
*Assistant Examiner*—Camie S. Thompson
(74) *Attorney, Agent, or Firm*—Renner, Otto, Boisselle & Sklar, LLP

(57) ABSTRACT

The invention relates to an adhesive composition, comprising: (A) at least one phenolic resole resin; and (B) the product made by reacting (B-1) at least one difunctional epoxy resin, with (B-2) at least one compound represented by the formula (I)

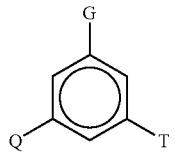

or (II)

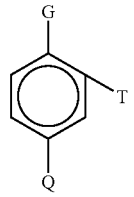

wherein in Formulae (I) and (II): G, T and Q are each independently functional groups selected from the group consisting of COOH, OH, SH, $NH_2$, $NHR^1$, $(NHC(=NH))_m NH_2$, $R^2COOH$, $NR^1{}_2$, $C(O)NHR^1$, $R^2NR^1{}_2$, $R^2OH$, $R^2SH$, $R^2NH_2$ and $R^2NHR^1$, wherein $R^1$ is a hydrocarbon group, $R^2$ is an alkylene or alkylidene group and m is a number in the range of 1 to about 4; T can also be $R^1$, $OR^1$ or $SO_2C_6H_4$—$NH_2$; and Q can also be H. The invention also relates to copper foils having the foregoing adhesive composition adhered to at least one side thereof to enhance the adhesion between said foils and dielectric substrates. The invention also relates to laminates comprising copper foil, a dielectric substrate, and an adhesion-promoting layer comprising the foregoing adhesive composition disposed between and adhered to the foil and the substrate.

19 Claims, No Drawings

ADHESIVE COMPOSITIONS AND COPPER FOILS AND COPPER CLAD LAMINATES USING SAME

Matter enclosed in heavy brackets [ ] appears in the original patent but forms no part of this reissue specification; matter printed in italics indicates the additions made by reissue.

TECHNICAL FIELD

This invention relates to adhesive compositions and, more particularly, to adhesive compositions for use with copper foils. The invention adhesive compositions provide copper foils with an adhesion-promoting layer which facilitates the production of laminates used in making printed circuit boards.

BACKGROUND OF THE INVENTION

Nearly half of the laminates manufactured for the printed circuit board industry use copper foil coated with an adhesive. These foils are laminated to a phenolic prepreg to make a low cost, copper clad paper phenolic laminate. The adhesives tend to fall into two categories: (1) a water dispersed adhesive composed of a copolymer of acrylonitrile and methacrylate and a phenolic resole, and (2) a solvent based adhesive composed of a phenolic resole, a polyvinylbutyral resin and a multifunctional epoxy, typically an epoxidized phenolic novolac.

Generally, these adhesives either provide good adhesion to metal and laminate as measured by peel strength, but less than satisfactory high temperature stability as measured by the solder blister resistance test; or they provide good high temperature stability, but less than satisfactory adhesion. This is because each of these goals are usually in direct conflict with one another. A material that is flexible enough to have high adhesion will generally exhibit too much flow at elevated temperatures to provide sufficient heat resistance. To have good heat resistance, an adhesive must have a relatively high rigidity, but such high rigidity tends to reduce peel strength.

These problems have been overcome by the present invention. By virtue of the present invention there has been developed an adhesive composition that provides both good adhesion as measured by peel strength testing and good heat resistance as measured by solder blister testing.

SUMMARY OF THE INVENTION

This invention relates to an adhesive composition, comprising: (A) at least one phenolic resole resin; and (B) the product made by reacting (B-1) at least one difunctional epoxy resin, with (B-2) at least one compound represented by the formula (I)

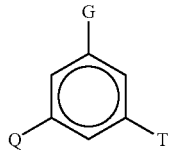

or

-continued (II)

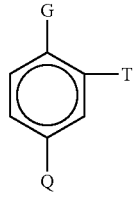

wherein in Formulae (I) and (II); G, T and Q are each independently functional groups selected from the group consisting of COOH, OH, SH, $NH_2$, $NHR^1$, $(NHC(=NH))_m NH_2$, $R^2COOH$, $NR^1{}_2$, $C(O)NHR^1$, $R^2NR^1{}_2$, $R^2OH$, $R^2SH$, $R^2NH_2$ and $R^2NHR^1$, wherein $R^1$ is a hydrocarbon group, $R^2$ is an alkylene or alkylidene group and m is a number in the range of 1 to about 4; T can also be $R^1$, $OR^1$ or $SO_2C_6H_4$—$NH_2$; and Q can also be H. The invention also relates to copper foils having the foregoing adhesive composition adhered to at least one side thereof to enhance the adhesion between said foils and dielectric substrates. The invention also relates to laminates comprising copper foil, a dielectric substrate, and an adhesion-promoting layer comprising the foregoing adhesive composition disposed between and adhered to the foil and the substrate.

DESCRIPTION OF THE PREFERRED EMBODIMENTS

The phenolic resole resin (A) typically has a gel time in the range of about 30 to about 180 seconds at 150° C., and in one embodiment from about 70 to about 140 seconds at 150° C. These resoles are typically provided in diluted form, the diluent being a suitable solvent such as ethanol, having a solids content of, for example, about 50% to about 70% by weight, and in one embodiment about 55% to about 65% by weight. Useful resoles include PR-GNF-1 (a product of Sumitomo Durez identified as having a 60% by weight solids content in ethanol and a gel time of 90 to 140 seconds at 150° C.); Arofene 536-E-56 (a product of Ashland Chemical identified as having a 56% by weight solids content in ethanol and a gel time of 40 to 55 seconds at 150° C.); Rutaphen IV 2441 (a product of Bakelite identified as having a 70% by weight solids content in water and alcohol and a gel time of 120 to 160 seconds at 150° C.); Arofene 536 ME (a product of Ashland Chemical identified as having a 65% by weight solids content in methanol and a gel time of 45 to 65 seconds at 150° C.); 986-ZI (a product of Ashland Chemical identified as having a 50% by weight solids content in methoxy propanol acetate and dipropylene glycol monomethyl ether and a gel time of 90 to 110 seconds at 150° C.).

The difunctional epoxy resin (B-1) can be any difunctional epoxy resin having an average molecular weight in the range of about 1000 to about 10,000 (epoxy equivalent weight of about 500 to about 5000), and in one embodiment an average molecular weight of about 1000 to about 6000. (A difunctional epoxy resin is an epoxy resin that contains an average of two epoxy groups per molecule.) In one embodiment, a mixture of difunctional epoxy resins is used, one having an average molecular weight of about 1000 to about 3000, preferably about 1500 to about 2500; and the other having an average molecular weight in excess of about 3000 up to about 6000, preferably about 3500 to about 5000.

In one embodiment, the difunctional epoxy resin (B-1) is a compound represented by the formula:

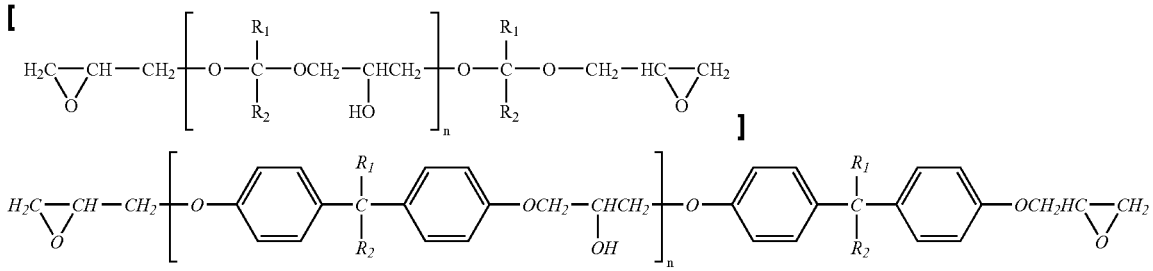

wherein in Formula (II), $R^1$ and $R^2$ are independently hydrogen or hydrocarbon groups in the range of 1 to about 20 carbon atoms, and n is a number in the range of 1 to about 20, preferably 1 to about 6, and in one embodiment 1 to about 3, and in another embodiment 1 or 2. Examples include: bisphenol A wherein $R^1$ and $R^2$ are each $CH_3$; bisphenol F wherein $R^1$ and $R^2$ are each H; bisphenol AD wherein $R^1$ is H and $R^2$ is $CH_3$. Others include resins wherein: $R^1$ is H and $R^2$ is $C_6H_{13}$; $R^1$ is H and $R^2$ is $C_{12}H_{25}$; $R^1$ is $CH_3$ and $R^2$ is $C_2H_5$; $R^1$ is $CH_3$ and $R^2$ is $C_4H_9$; etc.

Examples of commercially available difunctional epoxy resins include DER 661 (a product of Dow Chemical identified as a bisphenol A epoxy resin having an epoxy equivalent weight of about 500–560); DER 664 (a product of Dow Chemical identified as a bisphenol A epoxy resin having an epoxy equivalent weight of about 875–975); and DER 667 (a product of Dow Chemical identified as a bisphenol A having an epoxy equivalent weight of 1600–2000).

The compound (B-2) is at least one compound represented by the formula (I)

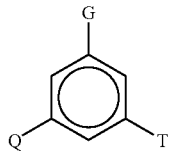

or (II)

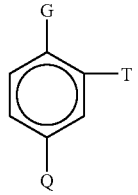

In Formulae (I) and (II), G, T and Q are each independently functional groups selected from the group consisting of COOH, OH, SH, $NH_2$, $NHR^1$, $(NHC(=NH))_mNH_2$, $NR^1_2$, $C(O)NHR^1$, $R^2NR^1_2$, $R^2COOH$, $R^2OH$, $R^2SH$, $R^2NH_2$ and $R^2NHR^1$, wherein $R^1$ is a hydrocarbon group, preferably an alkyl group, of 1 to about 6 carbon atoms, more preferably 1 to about 3 carbon atoms, and $R^2$ is an alkylene or alkylidene group, preferably an alkylene group, of 1 to about 6 carbon atoms, more preferably 1, 2 or 3 carbon atoms, and m is a number in the range of 1 to about 4 and in one embodiment m is 2, T can also be $R^1$, $OR^1$ or $SO_2C_6H_4NH_2$, Q can also be H. G is preferably $NH_2$, OH or $CH_2NH_2$. T is preferably $NH_2$, OH, $CH_2NH_2$, $CH_3$ or $OCH_3$. Q is preferably H or OH.

Useful examples of compound (B-2) include m-aminophenol, m-phenylene diamine,, 1,3-xylylenediamine, 1,3,5-trihydroxy benzene, resorcinol, 3-anisidine, 3-toluidine, bis(3-aminophenyl)sulfone, and mixtures of two or more thereof.

Components (B-1) and (B-2) are reacted with each other prior to being combined with component (A). This reaction can be effected by contacting component (B-1) with component (B-2) under reaction conditions until the desired product is obtained. The ratio of equivalents of (B-1) to (B-2) is generally from about 1:0.75 to about 1:2, and in one embodiment from about 1:1 to about 1:1.5. The weight of an equivalent of component (B-1) is determined by dividing the molecular weight of component (B-2) by the average number of epoxy groups per molecule (B-1). The weight of an equivalent of (B-2) is the molecular weight of (B-2).

When components (B-1) and (B-2) are reacted with each other the reaction temperature is generally from about 60° C. to about 150° C., and in one embodiment from about 80° C. to about 110° C. The time required to complete the reaction is dependent upon the desired degree of reaction, but is generally from about 2 to about 24 hours, and in one embodiment from about 4 to about 8 hours. In one embodiment at least about 80% of the epoxy groups in (B-1) are reacted with component (B-2). In one embodiment either or both of components (B-1) and (B-2) are dissolved in a suitable solvent prior to being reacted with each other. Examples of such solvents include methylisobutylketone, methyl ethyl ketones, benzene, toluene, acetone, tetrahydrofuran, etc.

The inventive adhesive compositions preferably comprise from about 10% to about 50% by weight, and in one embodiment about 20% to about 40% by weight of the phenolic resole resin (A); and from about 50% to about 90% by weight, and in one embodiment about 60% to about 80% by weight of the reaction product (B).

In one embodiment the inventive adhesive compositions contain an effective amount of at least one low molecular weight difunctional epoxy compound to enhance the adhesive characteristics of these compositions. These low molecular weight epoxies typically have molecular weights in the range of about 160 to about 400, and in one embodiment from about 200 to about 250. In one embodiment the low molecular weight epoxy is represented by the formula (III)

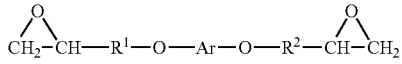

wherein in Formula (III), Ar is an aromatic or cycloaliphatic group of the type discussed above with respect to Formula (I) with the mononuclear groups (e.g., benzene) being preferred, and $R^1$ and $R^2$ are independently alkylene or alkylidene groups of preferably 1 to about 6 carbon atoms, and in one embodiment from 1 to about 3 carbon atoms. An example of a useful low molecular weight difunctional epoxy is one in which Ar is a benzene nucleus, and $R^1$ and $R^2$ are each methylene; this compound being available under the tradename Heloxy 69 from Rhone Poulenc. These low molecular weight difunctional epoxies are present in the inventive adhesive compositions at concentrations of up to about 10% by weight, and in one embodiment up to about 5% by weight.

The foil used with this invention is preferably a copper or copper-based alloy foil. These foils are well known in the art and are made using one of two techniques. Wrought or rolled foil is produced by mechanically reducing the thickness of a copper or copper alloy strip or ingot by a process such as rolling. Electrodeposited foil is produced by electrolytically deposited copper ions on a rotating cathode drum and then peeling the deposited strip from the cathode. Electrodeposited copper foils are especially preferred.

The copper foils typically have nominal thicknesses ranging from about 0.0002 inch to about 0.02 inch. Foil thickness is sometimes expressed in terms of weight and typically the foils of the present invention have weights or thicknesses ranging from about ⅛ to about 14 oz/ft$^2$.

Electrodeposited copper foils have a smooth or shiny (drum) side and a rough or matte (copper deposit growth front) side. The inventive adhesive composition can be adhered to either side of the foil and in some instances is adhered to both sides.

In one embodiment, the side or sides of the foil (electrodeposited or wrought) to which the adhesion-promoting layer is adhered is a "standard-profile surface," "low-profile surface" or "very-low-profile surface." The term "standard-profile surface" is used herein to refer to a foil surface having an $R_{tm}$ of about 10 μm or less. The term "low-profile surface" refers to a foil surface having an $R_{tm}$ of about 7 μm or less. The term "very-low-profile surface" refers to a foil surface having an $R_{tm}$ of about 4 μm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

Although the inventive foils can be subjected to a surface roughening treatment prior to the application of the inventive adhesive, it is a significant advantage of the invention that desired adhesive characteristics for the foil can be achieved without subjecting the foil to an added surface roughening treatment. Thus, in one embodiment of the invention, the foil is characterized by the absence of any added surface roughening treatment on the side or sides to which the inventive adhesive is adhered. The term "added surface roughening treatment" refers to any treatment performed on a base or raw foil that increases the roughness of the surface of the foil. These treatments include copper deposited electrolytically in nodular or powder form, or copper oxide which grows nodular or dendritic. In one embodiment, mechanical roughness imparted to wrought copper foil during rolling or by subsequent abrasion which increases roughness beyond that of a standard profile surface is considered to be an added surface roughening treatment. In one embodiment, roughness imparted to an electrodeposited copper foil during electrodeposition which increases roughness beyond that of a standard profile surface is considered to be an added surface roughening. In one embodiment, any roughness imparted to the raw or base copper foil that increases the roughness of said foil beyond that of a standard profile surface is considered to be an added surface roughening treatment. In one embodiment, any roughness imparted to the raw or base copper foil that increases the roughness of said foil beyond that of a low-profile surface is considered an added surface roughening treatment. In one embodiment, any roughness imparted to the raw or base copper foil that increases the roughness of said foil beyond that of a very low profile surface is considered an added surface roughening treatment.

In one embodiment, the side or sides of the base or raw foil to which the inventive adhesive composition is adhered is untreated prior to the application of the inventive adhesive composition to the foil. The term "untreated" is used herein to refer to raw or base foil that has not undergone subsequent treatment for the purpose of refining or enhancing the foil properties.

As indicated above, it is within the scope of the invention to apply to foils which have been subjected to an added surface roughening treatment the inventive adhesive composition. Thus, in one embodiment, one or both sides of the foil are treated with a roughened layer of copper or copper oxide prior to the application of the inventive adhesive composition. The copper can be deposited electrolytically in nodular or powder form. The copper oxide can grow nodular or dendritic.

In one embodiment, the side or sides of the base or raw foil to which the inventive adhesive composition is adhered is treated, prior to the application of the inventive adhesive composition with one or more surface treatment layers for the purpose of refining or enhancing the foil properties. Any side of the foil which does not have the inventive adhesive composition applied to it can, optionally, also have one or more of such treatment layers applied to it. These surface treatments are known in the art.

In one embodiment one or both sides of the foil are treated with at least one metallic layer, the metal in said metallic layer being selected from the group consisting of indium, zinc, tin, nickel, cobalt, brass, bronze, and mixtures of two or more thereof, prior to the application of the inventive adhesive composition. Metallic layers of this type are sometimes referred to as barrier layers. These metallic layers preferably have thicknesses in the range of about 0.01 to about 1 micron, more preferably about 0.05 to about 0.1 micron.

In one embodiment one or both sides of the foil are treated with at least one metallic layer, the metal in said metallic layer being tin, chromium, chromium-zinc alloy, zinc, nickel, molybdenum, aluminum, or a mixture of two or more thereof, prior to the application of the inventive adhesive composition. Metallic layers of this type are sometimes referred to as stabilization layers. These metallic layers preferably have thicknesses in the range of about 0.005 to about 0.05 micron, more preferably about 0.01 to about 0.02 micron.

In one embodiment, one or both sides of the foil are first treated with at least one barrier layer, then at least one stabilization layer, as discussed above, prior to the application of the inventive adhesive composition.

In one embodiment, one or both sides of the foil are treated with at least one roughened layer of copper or copper oxide, then at least one barrier layer of the type discussed above prior to the application of the inventive adhesive composition.

In one embodiment, one or both sides of the foil are treated with at least one roughened layer of copper or copper oxide, then at least one stabilization layer of the type discussed above is adhered to the layer of copper or copper oxide prior to the application of the inventive adhesive composition.

In one embodiment, one or both sides of the foil are treated with at least one roughened layer of copper or copper oxide, then at least one barrier layer of the type discussed above is adhered to the roughened layer, then at least one stabilization layer is adhered to the barrier layer prior to the application of the inventive adhesive composition.

In one embodiment, one or both sides of the foil is treated with an adhesion-promoting amount of at least one organofunctional silane. The silane can be adhered to the base foil or any of the treatment layers discussed above. It is used as the outermost treatment layer on the foil and contacts the inventive adhesive composition when the latter is applied to the foil over the organofunctional silane layer. The silane can be at least one silane coupling agent represented by the formula $$R^1_{4-n}SiX_n \quad \text{(IV)}$$

wherein in Formula (IV), $R^1$ is a functionally substituted hydrocarbon group, the functional substituent of said functionally substituted hydrocarbon group being amino, hydroxy, halo, mercapto, alkoxy, acyl, or epoxy; X is a hydrolyzable group; and n is 1, 2 or 3. Examples of organofunctional silanes that can be used include glycidoxypropyltrimethoxy silane, aminopropyl trimethoxysilane, N-(2-aminoethyl)-3-aminopropyltrimethoxy silane, tetraethoxy silane, mixtures of two or more thereof, etc. Mixtures of glycidoxypropyltrimethoxy silane and tetraethoxy silane are useful; these include mixtures of these two silanes at weight ratios of about 95:5 to about 5:95, and in one embodiment at about 50:50. Mixtures of N-(2-aminoethyl)-3-amino propyltrimethoxysilane and tetraethoxy silane are also useful; these include mixtures of these two silanes at weight ratios of about 1:99 to about 99:1, and in one embodiment from about 10:90 to about 90:10.

The inventive adhesive composition is adapted for enhancing adhesion between the foil and a dielectric substrate. The inventive adhesive is applied to one or both sides of the foil, the foil surface to which the resulting inventive adhesive composition is applied being untreated or treated as discussed above. The inventive adhesive composition may be applied to the foil surface using known application methods which include reverse roller coating, doctor blade coating, dipping, painting and spraying. The process of applying the inventive adhesive composition may be repeated, if desired, several times.

The application of the inventive adhesive composition to the foil surface is typically effected at a temperature of preferably about 15° C. to about 45° C., more preferably about 20° C. to about 30° C. Following application of the inventive adhesive composition to the foil surface, the inventive adhesive composition is semi-cured (B-staged) by heating it to a temperature of preferably about 90° C. to about 180° C., and in one embodiment about 140° C. to 170° C., for preferably about 0.5 to about 10 minutes, and in one embodiment about 1 to about 5 minutes to enhance drying of the surface. The dry film weight of the B-staged epoxy adhesive on the foil is preferably from about 20 to about 50 grams per meter squared (gm/m$^2$), more preferably about 25 to about 35 gms/m$^2$.

The inventive copper foils with the B-staged adhesive applied thereto generally have a matte-side roughness $R_{tm}$, of about 2 to about 18 μm, and in one embodiment about 4 to about 11 μm, and in another embodiment about 5 to about 8 μm. In one embodiment of the invention, these foils have weights of about ½ ounce per square foot and the $R_{tm}$ of the matte side is about 2 to about 12 μm, or about 4 to about 8 μm. In one embodiment, these foils have weights of about 1 ounce per square foot and the $R_{tm}$ of the matte side is about 2 to about 16 μm, or about 5 to about 9 μm. In one embodiment, these foils have weights of about 2 ounces per square foot and the $R_{tm}$ of the matte side is about 6 to about 18 μm, or about 8 to about 11 μm. In one embodiment $R_{tm}$ for the shiny side of these foils is less than about 4 μm, or less than about 3 μm, or is in the range of about 1.5 to about 3 μm, or about 2 to about 2.5 μm.

The inventive copper foils with the B-staged adhesive applied thereto can be bonded to dielectric substrates. The adhesion promoting layer provided by the inventive adhesive composition enhances the bond or peel strength between the copper foil and the dielectric substrate. An advantage of the inventive copper foils in that these foils can avoid the application of any added surface roughening, yet exhibit effective bond or peel strength with dielectric substrates. These foils can have a standard profile surface, low-profile surface and even a very low-profile surface, and yet provide acceptable peel strengths. With the inventive foils, either the matte side or shiny side can be effectively bonded to a dielectric substrate.

Useful dielectric substrates may be prepared by impregnating woven glass reinforcement materials or paper sheets with partially cured resins, usually phenolic resins. Other useful resins include amino type resins produced from the reaction of formaldehyde and urea or formaldehyde and melamine, polyesters, epoxies, silicones, polyamides, polyimides, bismaleimides, polyphenyleneoxides, cyanateesters, di-allylphthalates, phenylsilanes, polybenizimidazoles, diphenyloxides, polytetrafluoroethylenes, and the like, as well as mixtures of two or more thereof. Particularly useful are the paper phenolic substrates. These sheets often contain modifying resins of which tung oil is an example. These dielectric substrates are sometimes referred to as prepregs.

In preparing the laminates, it is useful for both the prepreg material and the copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise one or more prepreg sheets with a sheet of foil on either side thereof or on one side, and in each instance, the side (or one of the sides) of the copper foil sheet with the adhesion-promoting layer adhered thereto is positioned adjacent the prepreg.

The assemblage may be subjected to conventional laminating temperatures and pressures between the plates of laminating presses to prepare laminates comprising sandwiches of a sheet or sheets of prepreg between sheets of copper foil. Alternatively, a continuous lamination process may be used where the foil and prepreg are unrolled and passed through a heated press as a continuous web and cut into sheets afterwards.

The prepregs may consist of a woven glass or paper reinforcement fabric impregnated with a partially cured two-stage resin. By application of heat and pressure, the copper foil is pressed tightly against the prepreg and the temperature to which the assemblage is subjected activates the resin to cause curing, that is crosslinling of the resin and thus tight bonding of the foil to the prepreg dielectric substrate. Generally speaking, the laminating operation will involve pressures in the range of from about 1000 to about 2000 psi, temperatures in the range of from about 150° C. to 180° C. and a laminating cycle of from about 50 minutes to about 2 hours. In one embodiment, a continuous lamination process is used wherein a vacuum is used, the temperature is up to about 200° C., and the lamination time is less than about 30 minutes. The finished laminate may then be utilized to prepare printed circuit boards (PCB).

A number of manufacturing methods are available for preparing PCBs from laminates. Additionally, there is a myriad of possible end use applications including radios, televisions, computers, etc., for the PCB's. These methods and end uses are known in the art.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

EXAMPLES 1–6

Adduct (B-I)

20.2 grams of DER 664 (a product of Dow Chemical identified as a bisphenol A epoxy resin having an epoxy equivalent weight of about 875–975) are mixed with 3 grams of resorcinol in 20 ml of methylisobutylketone and heated under reflux conditions (b.p. 116–117° C.) for 15 hours to provide the desired product.

Adduct (B-II)

100 grams of DER 664 are mixed with 12.2 grams of 3-aminophenol in 100 ml of methylisobutylketone and heated under reflux conditions (b.p. 116–117° C.) for 6 hours to provide the desired product.

Adducts (B-I) and (B-II) are mixed with the phenolic resole resins indicated in Table I below to provide the roll coat formulations indicated in the table. The foil that is used is an electrodeposited copper foil having a weight of 1 oz/ft$^2$, and having treatment layers of copper oxide followed by brass and then chromium-zinc alloy. The formulations indicated in Table I are applied to the matte surface of the foil and partially cured or B-staged at a temperature of 150° C. for the 0.25 to 5 minutes as indicated in Table 1. The foil with the B-staged inventive adhesive composition applied thereto is then laminated to a paper phenolic substrate at a lamination temperature of 150° C. and pressure of 1000 psig for 82 minutes. The resulting laminates are tested for adhesion using the peel strength test (2.4.8 of IPC-TM-650) and heat resistance using the solder blister test (JIS C 6481 5.5). The results are indicated in Table I. Example 6 in Table I is a control wherein no adhesive is used.

TABLE I

| Example | Formulation | B-Stage Minutes | Peel Strength (Pounds/Inch) | Second Blister (Seconds) |
|---|---|---|---|---|
| 1 | 75% Adduct (B-I) | 2 | 9.67 | 30 |
| | 25% Rutaphen IV 2441 | 4 | 9.52 | 21 |
| 2 | 50% Adduct (B-I) | 2 | 6.08 | 27 |
| | 50% Rutaphen IV 2441 | 4 | 5.78 | 12 |
| 3 | 75% Adduct (B-II) | 0.25 | 7.63 | 22 |
| | 25% Rutaphen IV 2441 | 1.5 | 7.72 | 20 |
| 4 | 75% Adduct (B-II) | 0.5 | 10.71 | 21 |
| | 25% 536-ME | 2 | 10.29 | 16 |

TABLE I-continued

| Example | Formulation | B-Stage Minutes | Peel Strength (Pounds/Inch) | Second Blister (Seconds) |
|---|---|---|---|---|
| 5 | 70% Adduct (B-II) | 0.5 | 9.56 | 20 |
| | 15% Rutaphen IV 2441 | 1 | 9.75 | 19 |
| | 15% 986-Z1 | 2 | 9.52 | 24 |
| | | 3 | 9.72 | 20 |
| 6 | No adhesive | | 5.84 | 19 |

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An adhesive composition, comprising:

(A) at least one phenolic resole resin; and (B) the product made by reacting (B-1) at least one difunctional epoxy resin, with (B-2) at least one compound represented by the formulae (I)

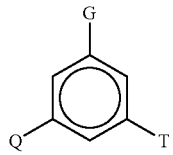

or (II)

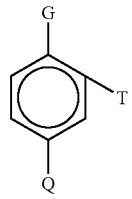

wherein in Formulae (I) and (II):

G, T and Q are each independently functional groups selected from the group consisting of COOH, OH, SH, $NH_2$, $NHR^1$, $(NHC(=NH))_mNH_2$, $R^2COOH$, $R^2OH$, $NR^1{}_2$, $C(O)NHR^1$, $R^2NR^1{}_2$, $R^2SH$, $R^2NH_2$ and $R^2NHR^1$, wherein $R^1$ is a hydrocarbon group, $R^2$ is an alkylene or alkylidene group and m is a number in the range of 1 to about 4; T can also be $R^1$, $OR^1$ or $SO_2C_6H_4$—$NH_2$; and Q can also be H.

2. The composition of claim 1 wherein (A) has a gel time of about 30 to about 180 seconds at 150° C.

3. The composition of claim 1 wherein (A) has a solids content of about 50% to about 70% by weight prior to being combined with (B).

4. The composition of claim 1 wherein said difunctional epoxy resin (B-1) is a compound represented by the formula

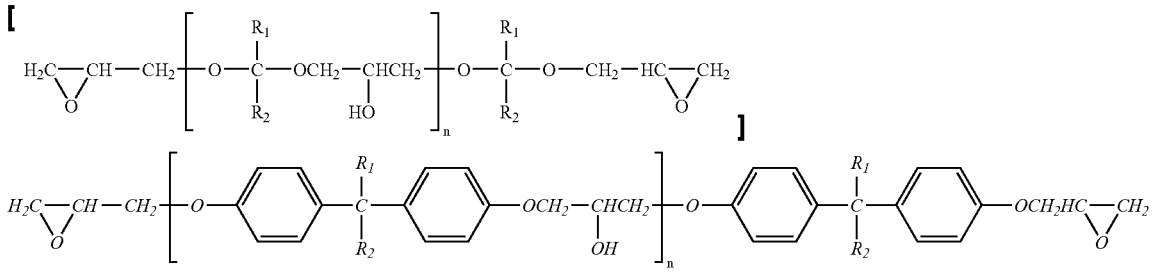

wherein in Formula (II), $R^1$ and $R^2$ are independently hydrogen or hydrocarbon groups in the range of 1 to about 20 carbon atoms, and n is a number in the range of 1 to about 20.

5. The composition of claim 1 wherein said difunctional epoxy resin (B-1) is a bisphenol A, bisphenol F or bisphenol AD.

6. The composition of claim 1 wherein said compound (B-2) is a compound selected from the group consisting of m-aminophenol, m-phenylene diamine, 1,3-xylylenediamine, 1,3,5-trihydroxy benzene, resorcinol, 3-anisidine, 3-toluidine, bis(3-aminophenyl)sulfone, and mixtures of two or more thereof.

7. The composition of claim 1 further comprising at least one low molecular weight difunctional epoxy represented by the formula

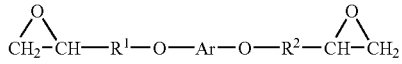

(III)

wherein in Formula (III), Ar is an aromatic or cycloaliphatic group, and $R^1$ and $R^2$ are independently alkylene or alkylidene groups of 1 to about 6 carbons.

8. A copper foil with an adhesion-promoting layer overlying at least one side of said foil, said adhesion-promoting layer, comprising:

(A) at least one phenolic resole resin; and (B) the product made by reacting (B-1) at least one difunctional epoxy resin, with (B-2) at least one compound represented by the formulae

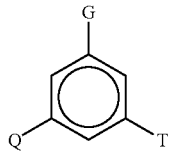

(I)

or

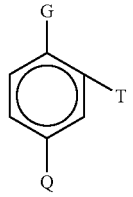

(II)

wherein in Formulae (I) and (II):

G, T and Q are each independently functional groups selected from the group consisting of COOH, OH, SH, $NH_2$, $NHR^1$, $(NHC(=NH))_mNH_2$, $R^2COOH$, $R^2OH$, $NR^1{}_2$, $C(O)NHR^1$, $R^2NR^1{}_2$, $R^2SH$, $R^2NH_2$ and $R^2NHR^1$, wherein $R^1$ is a hydrocarbon group, $R^2$ is an alkylene or alkylidene group and m is a number in the range of 1 to about 4; T can also be $R^1$, $OR^1$ or $SO_2C_6H_4$—$NH_2$; and Q can also be H.

9. The foil of claim 8 wherein said foil is an electrodeposited copper foil.

10. The foil of claim 8 wherein said foil is a wrought copper foil.

11. The foil of claim 8 with at least one silane coupling agent disposed between said one side of said foil and said adhesion-promoting layer, said silane coupling agent being at least one compound represented by the formula $$R^1{}_{4-n}SiX_n \qquad \text{(IV)}$$

wherein in Formula (IV), $R^1$ is a functionally substituted hydrocarbon group, the functional substituent of said functionally substituted hydrocarbon group being amino, hydroxy, halo, mercapto, alkoxy, acyl, or epoxy; X is a hydrolyzable group; and n is 1, 2 or 3.

12. The foil of claim 8 wherein at least one roughened layer of copper or copper oxide is positioned between said one side of said foil and said adhesion promoting layer.

13. The foil of claim 8 wherein at least one metallic layer is positioned between said one side of said foil and said adhesion promoting layer, the metal in said metallic layer being selected from the group consisting of indium, tin, nickel, cobalt, brass, bronze or a mixture of two or more thereof.

14. The foil of claim 8 wherein at least one roughened layer of copper or copper oxide is adhered to said one side of said foil, at least one metallic layer is adhered to said layer of copper or copper oxide, the metal in said metallic layer being selected from the group consisting of indium, zinc, tin, nickel, cobalt, brass, bronze, or a mixture of two or more thereof, and said adhesion promoting layer is adhered to said metallic layer.

15. The foil of claim 8 wherein at least one metallic layer is positioned between said one side of said foil and said adhesion promoting layer, the metal in said metallic layer being selected from the group consisting of tin, chromium, chromium-zinc mixture, nickel, molybdenum, aluminum, and mixtures of two or more thereof, and said adhesion promoting layer is adhered to said metallic layer.

16. The foil of claim 8 wherein at least one roughened layer of copper or copper oxide is adhered to said one side of said foil, at least one metallic layer is adhered to said layer of copper or copper oxide, the metal in said metallic layer being selected from the group consisting of tin, chromium, and chromium-zinc alloy, zinc, nickel, molybdenum, aluminum, and mixtures of two or more thereof, at least one layer of at least one silane coupling agent is adhered to said metallic layer, and said adhesion promoting layer is adhered to said silane coupling agent layer.

17. The foil of claim 8 wherein at least one first metallic layer is adhered to said one side of said foil, the metal in said first metallic layer being selected from the group consisting of indium, tin, nickel, cobalt, brass and bronze, at least one second metallic layer adhered to said first metallic layer, the metal in said second metallic layer being selected from the group consisting of tin, chromium, chromium-zinc mixture, zinc, nickel, molybdenum, aluminum, and mixtures of two or more thereof, at least one layer of at least one silane coupling agent is adhered to said second metallic layer, and said adhesion promoting layer is adhered to said silane coupling agent layer.

18. The foil of claim 8 wherein at least one roughened layer of copper or copper oxide is adhered to said one side of said foil, at least one first metallic layer is adhered to said roughened layer, the metal in said first metallic layer being selected from the group consisting of indium, zinc, tin, nickel, cobalt, copper-zinc alloy and copper-tin alloy, at least one second metallic layer is adhered to said first metallic layer, the metal in said second metallic layer being selected from the group consisting of tin, chromium, chromium-zinc alloy, zinc, nickel, molybdenum, aluminum, and mixtures of two or more thereof, at least one layer of at least one silane coupling agent is adhered to said second metallic layer, and said adhesion promoting layer is adhered to said silane coupling agent layer.

19. A laminate comprising copper foil, a dielectric substrate, and an adhesion-promoting layer disposed between and adhered to said foil and said substrate, said adhesion promoting layer comprising:

(A) at least one phenolic resole resin; and (B) the product made by reacting (B-1) at least one difunctional epoxy resin, with (B-2) at least one compound represented by the formulae (I)

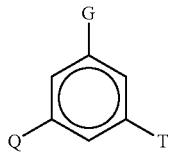

or (II)

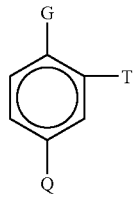

wherein in Formulae (I) and (II):

G, T and Q are each independently functional groups selected from the group consisting of COOH, OH, SH, $NH_2$, $NHR^1$, $(NHC(=NH))_mNH_2$, $R^2COOH$, $R^2OH$, $NR^1_2$, $C(O)NHR^1$, $R^2NR^1_2$, $R^2SH$, $R^2NH_2$ and $R^2NHR^1$, wherein $R^1$ is a hydrocarbon group, $R^2$ is an alkylene or alkylidene group and m is a number in the range of 1 to about 4; T can also be $R^1$, $OR^1$ or $SO_2C_6H_4$—$NH_2$; and Q can also be H.

* * * * *